United States Patent [19]
Sonntag et al.

[11] Patent Number: 5,859,564
[45] Date of Patent: Jan. 12, 1999

[54] DIFFERENTIAL AMPLIFIER CIRCUIT FOR USE IN A READ CHANNEL FOR A MAGNETIC RECORDING SYSTEM

[75] Inventors: Jeffrey Lee Sonntag, Rockland Township, Pa.; Suharli Tedja, Fremont, Calif.

[73] Assignee: Lucent Technologies Inc., Murray Hill, N.J.

[21] Appl. No.: 892,776

[22] Filed: Jul. 15, 1997

Related U.S. Application Data

[63] Continuation of Ser. No. 534,767, Sep. 27, 1995, abandoned.

[51] Int. Cl.$^6$ ....................................................... H03F 3/45
[52] U.S. Cl. .......................... 327/156.3; 327/89; 327/363; 330/258
[58] Field of Search ..................................... 327/334, 335, 327/563, 363, 65, 67, 89; 330/252–261; 360/46, 66–68

[56] References Cited

U.S. PATENT DOCUMENTS

| | | | |
|---|---|---|---|
| 4,904,953 | 2/1990 | McCormack | 330/258 |
| 4,914,398 | 4/1990 | Jove et al. | 361/111 |
| 5,006,817 | 4/1991 | Babanezhad | 330/258 |
| 5,049,831 | 9/1991 | Westwick | 330/258 |
| 5,187,448 | 2/1993 | Brooks et al. | 330/258 |
| 5,281,924 | 1/1994 | Maloberti et al. | 330/258 |
| 5,412,346 | 5/1995 | Burger, Jr. et al. | 330/282 |
| 5,424,677 | 6/1995 | Carson | 330/2 |

FOREIGN PATENT DOCUMENTS

| | | |
|---|---|---|
| 0 324 273 A2 | 7/1989 | European Pat. Off. . |
| 0 324 273 A3 | 7/1989 | European Pat. Off. . |
| 0 534 007 A1 | 3/1993 | European Pat. Off. . |
| 0 597 420 A1 | 5/1994 | European Pat. Off. . |

OTHER PUBLICATIONS

Furukawa et al, IEEE Journal of Solid State Circuits, vol. SC–10, No. 6, pp. 539–542, Dec. 1975.

R. D. Hempstead, "Thermally Induced Pulses in Magnetoresistive Heads," IBM Journal of Research & Development, Nov. 1974, vol. 18, No. 6, pp. 547–550.

Yufeng Li and Aric R. Kumaran, "The Determination Flash Temperature In Intermittent Magnetic Head/Disk Contacts Using Magnetoresistive Heads: Part I—Model and Laser Simulation," Journal of Tribology, Jan. 1993, vol. 115, pp. 170–184.

Tsividis, Yannis, Mihai Banu and John Khoury, "Continuous–Time MOSFET–C Filters in VLSI," *IEEE Transactions on Circuits and Systems*, vol. CAS–33, No. 2, Feb. 1986, pp. 125–140.

H. Suyama et al, "Thin Film MR Head for High Density Rigid Disk Drive," *IEE Transactions On Magnetics*, vol. 24, No. 6, Nov. 1988 pp. 2612–2616.

J. Sonntag et al, "High Speed, Low Power PRML Read Channel Device," *IEEE Transactions On Magnetics*, vol. 31, No. 2, Mar. 1995, pp. 1186–1195.

(List continued on next page.)

*Primary Examiner*—Kenneth B. Wells
*Attorney, Agent, or Firm*—James H. Fox

[57] ABSTRACT

Briefly, in accordance with one embodiment of the invention, a circuit includes: at least one differential amplifier. The differential amplifier is coupled in a circuit configuration so that the differential output voltage signal of the differential amplifier circuit includes a scalable second-order harmonic component of the differential input voltage signal applied to the differential amplifier circuit. Briefly, in accordance with another embodiment of the invention, a method of applying a differential input voltage signal to a differential amplifier circuit to produce a differential output voltage signal includes the step of: driving the differential amplifier circuit so that the differential output voltage signal of the differential amplifier circuit includes a second-order harmonic component of the differential input voltage signal.

12 Claims, 3 Drawing Sheets

OTHER PUBLICATIONS

Yannis Tsividis and Paolo Antognetti, *Design of MOS VLSI Circuits for Telecommunications,* "Continuous–Time Filters," Chapter 11, pp. 334–371. Prentice–Hall, Inc., 1985, Englewood Cliffs, NJ.

H. Suyama et al, "Thin Film MR Head for High Density Rigid Disk Drive," *IEEE Transactions On Magnetics*, vol. 24, No. 6, Nov. 1988, pp. 2612–2614.

5,859,564

DIFFERENTIAL AMPLIFIER CIRCUIT FOR USE IN A READ CHANNEL FOR A MAGNETIC RECORDING SYSTEM

RELATED APPLICATION

This application is a continuation divisional application under 37 CFR 1.62 of prior application Ser. No. 08/534,767 filed Sep. 27, 1995 by Jeffrey Lee Sonntag and Suharli Tedja for Differential Amplifier Circuit For Use In A Read Channel For A Magnetic Recording System, now abandoned.

This patent application is related to concurrently filed U.S. patent application Ser. No. 08/535,524, entitled "A Read Channel For At Least Partially Offsetting Nonlinear Signal Effects Associated With The Use Of Magneto-Resistive Heads," filed Sep. 27, 1995, by Sonntag, herein incorporated by reference and assigned to the assignee of the present invention.

TECHNICAL FIELD

The present invention is related to amplifier circuits, and more particularly, to differential amplifier circuits.

BACKGROUND OF THE INVENTION

Amplifiers, and, particularly, operational amplifiers and differential amplifiers, are well-known in the art. Such amplifiers have a variety of applications, such as described, for example, in *Design of MOS VLSI Circuits for Telecommunications*, edited by Y. Tsividis and P. Antognetti, published by Prentice-Hall, Inc. (1985), and herein incorporated by reference. Typically, it is desirable to ensure that such differential amplifiers and operational amplifiers operate linearly so that the output voltage signal is approximately an amplified version of the applied input voltage signal. However, it is sometimes also desirable to produce harmonic components of an applied voltage signal.

SUMMARY OF THE INVENTION

Briefly, in accordance with one embodiment of the invention, a circuit comprises: at least one differential amplifier. The differential amplifier is coupled in a circuit configuration so that the differential output voltage signal of the differential amplifier circuit includes a scalable second-order harmonic component of the differential input voltage signal applied to the differential amplifier circuit. Briefly, in accordance with another embodiment of the invention, a method of applying a differential input voltage signal to a differential amplifier circuit to produce a differential output voltage signal comprises the step of: driving the differential amplifier circuit so that the differential output voltage signal of the differential amplifier circuit includes a second-order harmonic component of the differential input voltage signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

DETAILED DESCRIPTION

Magnetic recording systems, such as disk drives, for example, employ electronic circuits to read electro-magnetically stored signals, such as those stored on a disk or diskette, for example. Typically, such systems employ magnetic induction to read the electro-magnetically stored signals, such as described, for example, in *An Introduction To Direct Access Storage Devices*, written by Hugh N. Sierra, published by Academic Press, Inc. (1990), and herein incorporated by reference. It has become increasingly popular to employ magneto-resistive (MR) read heads with such systems. One reason is because such read heads may provide improved signal-to-noise (S/N) ratios in comparison with other conventional types of read heads that may be employed with such systems.

Figure 2:
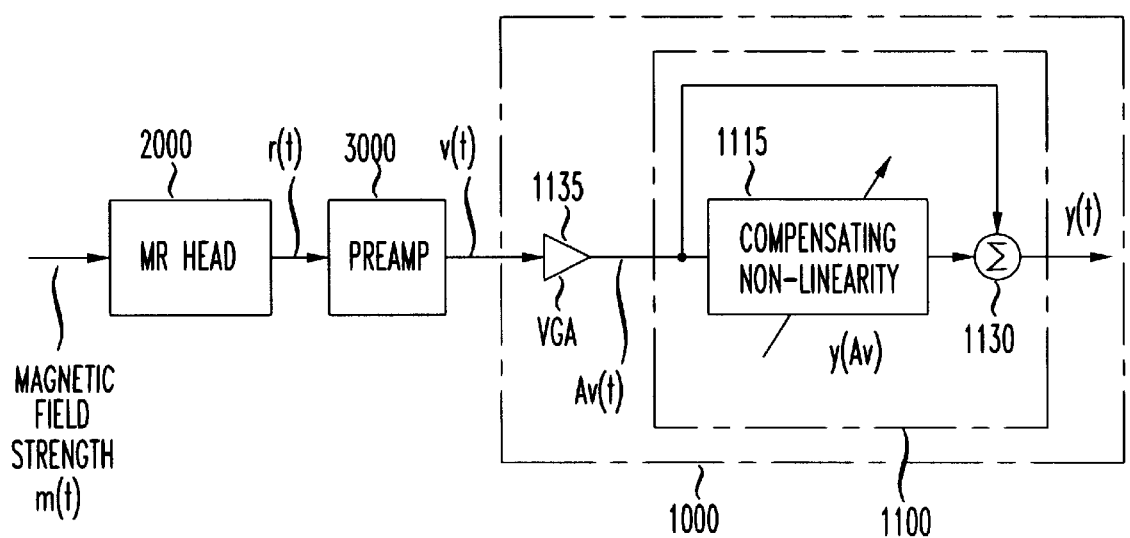
FIG. 2 is a block diagram illustrating an embodiment of a read channel for a magnetic recording system coupled to a magneto-resistive (MR) read head that may employ an embodiment of a differential amplifier circuit in accordance with the invention.

Aforementioned concurrently filed U.S. patent application Ser. No. 08/534,524, describes an embodiment of a read channel, such as may be used in a magnetic recording system, for at least partially offsetting nonlinear signal effects associated with the use of MR read heads. FIG. 2 illustrates a portion 1000 of an embodiment of a read channel described in that patent application. A MR head or MR read head 2000 is also illustrated in FIG. 2. Likewise, a preamplifier 3000 is illustrated. Where preamplifier 3000 is relatively wideband, the transfer function for the preamplifier may be approximated as a scale factor and/or a substantially constant delay. Of course, it is understood that appropriate components illustrated in the signal path are AC coupled in a manner so as to reduce or remove DC bias voltages.

As illustrated in FIG. 2, read channel 1000 includes a nonlinear adjustment 1100. Likewise nonlinear adjustment 1100 may be adapted so as to introduce a controllable amount of second-order nonlinearity into the magnetic recording read channel signal path, as described in more detail in the aforementioned concurrently filed U.S. patent application Ser. No. 08/534,524. In this particular embodiment illustrated in FIG. 2, nonlinear adjustment 1100 is illustrated as including compensating nonlinearity component 1115 in which the output signal provided by variable gain amplifier (VGA) 1135 is processed by compensating nonlinearity element 1115 so as to produce a nonlinear output signal, y(Av), such as a second-order harmonic component of the read channel voltage signal. Likewise, in this particular embodiment of a nonlinear adjustment, the output signal of VGA 1135 and the output signal of compensating nonlinearity element 1115 are then superpositioned at a summing node, such as node 1130 illustrated in FIG. 2.

Although FIG. 2 illustrates a block diagram embodiment of nonlinear adjustment 1100, it would be convenient if a circuit configuration implemented compensating nonlinearity element 1115 and summing node 1130. Furthermore, it would be convenient if this circuit configuration could be configured using conventional amplifiers or similar electronic circuitry.

Figure 1:
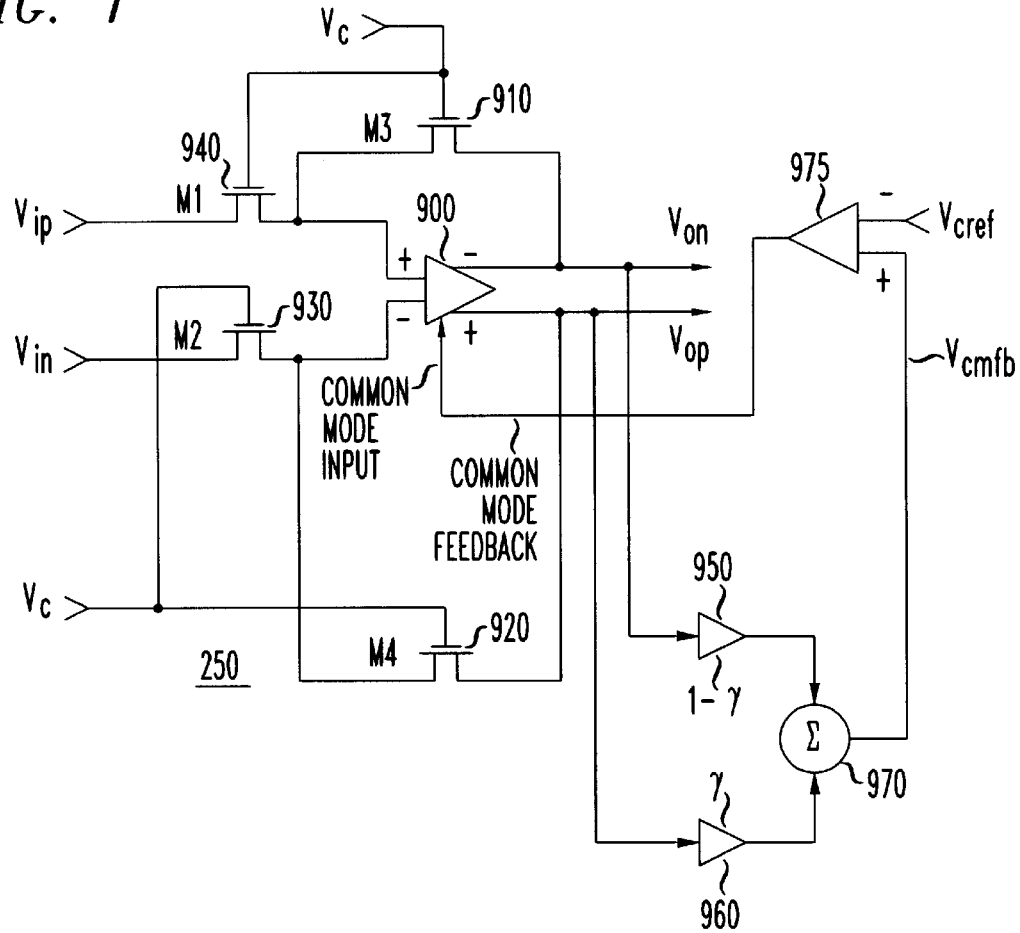
FIG. 1 is a circuit diagram illustrating an embodiment of a differential amplifier circuit in accordance with the invention

FIG. 1 illustrates an embodiment 250 of a differential amplifier circuit in accordance with the invention that may be employed to provide the desired nonlinear adjustment. As illustrated in FIG. 1, embodiment 250 comprises a conventional differential amplifier 900. Likewise, conventional MOS transistors are illustrated, such as transistors 910, 920, 930, and 940. Although not explicitly illustrated, either P-channel or N-channel MOS transistors will suffice. For the configuration illustrated in FIG. 1, the control voltage, $V_c$, may be of a sufficiently high magnitude to ensure that MOS transistors 910, 920, 930 and 940 remain substantially triode-biased, although the invention is not limited in scope in this respect, as explained in more detail hereinafter. As is well-known, by operating in the triode region, operationally the MOS transistors resemble resistors. See, for example, "Continuous-Time MOSFET-C Filters In VLSI," by Tsividis et al., *IEEE Transactions On Circuits And Systems*, Volume CAS-33, No. 2, February, 1986, herein incorporated by reference.

As illustrated in FIG. 1, in this particular embodiment, gamma ($\gamma$) may be employed to scale or control the amount of common mode (CM) feedback provided to differential amplifier 900. Thus, the relationship between $V_{cmfb}$, $V_{op}$ and $V_{on}$ may be described by the following equation.

$$V_{cmfb} = \gamma V_{op} + (1-\gamma)V_{on} \approx V_{cref} \quad (1)$$

where $V_{cref}$ is the common mode reference voltage level in this particular embodiment. Based on the configuration illustrated in FIG. 1, differential amplifier 975 operates in conjunction with differential amplifier 900 in a manner to maintain $V_{cmfb}$ substantially equal to $V_{cref}$. This relationship therefore provides the following equation.

$$0.5(V_{op}+V_{on}) \approx V_{cref} + (0.5-\gamma)(V_{op}-V_{on}) \quad (2)$$

Therefore, as will be explained in more detail hereinafter, the actual common mode output voltage signal of amplifier 900 includes a scalable fraction of the differential output voltage signal of amplifier 900. The fraction of the differential output voltage signal of amplifier 900 included in its common mode output voltage signal depends on the value of $\gamma$, in accordance with the configuration illustrated. Furthermore, in this particular embodiment, the output voltage signal of amplifier 900 comprises the output voltage signal of the differential amplifier circuit.

Because the actual common mode output voltage signal of amplifier 900 includes a scalable fraction of the differential output voltage signal of amplifier 900, the differential output voltage signal of amplifier 900, which in this embodiment is the differential output voltage signal of the differential amplifier circuit, includes a second-order harmonic component of the differential input voltage signal applied to the differential amplifier circuit, $V_{ip}-V_{in}$ in this particular embodiment, as will be explained in more detail hereinafter. Furthermore, the magnitude of this second-order harmonic component is adjustable or controllable. For example, adjusting $\gamma$ and/or adjusting the magnitude of $V_c$ will adjust the magnitude as desired, as also will be explained in more detail hereinafter.

Figure 5:
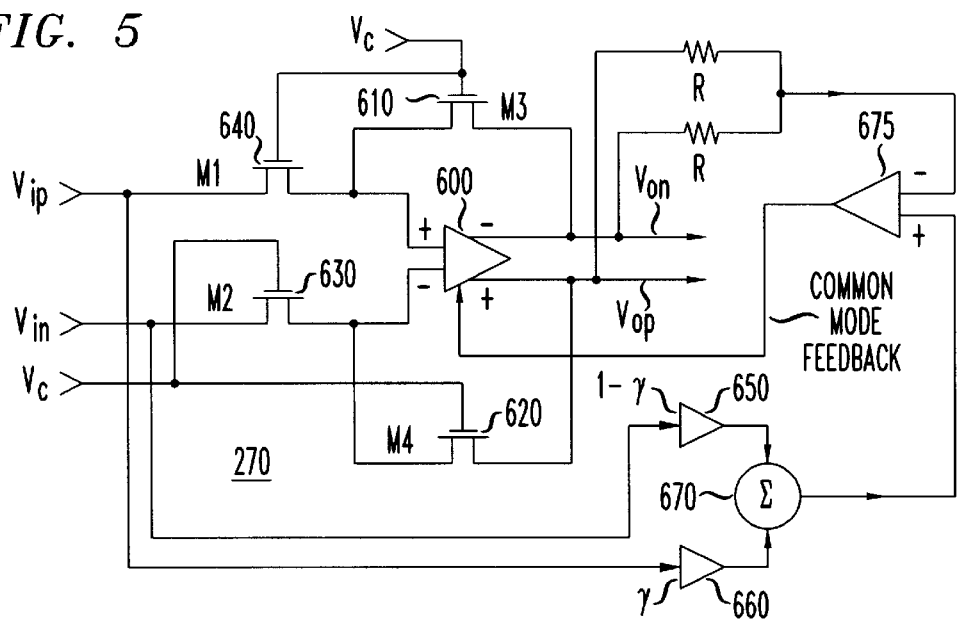
FIG. 5 is a circuit diagram illustrating yet another embodiment of a differential amplifier circuit in accordance with the invention.

FIG. 5 illustrates an embodiment 270 of a differential amplifier circuit in accordance with the invention in which a scalable fraction of the differential input voltage signal applied to the differential amplifier circuit is applied to amplifier 675 in a manner so as to drive the common mode output voltage signal of differential amplifier 600 to include a scalable fraction of the differential input voltage signal. As illustrated, the output voltage signal of amplifier 675 is applied as the common mode feedback voltage signal of amplifier 600. In this particular embodiment, the common mode feedback voltage signal and the common mode output voltage signal of amplifier 600 respectively comprise the common mode feedback voltage signal and the common mode output voltage signal of the differential amplifier circuit. This is similar in some respects to the approach employed in FIG. 1 and is employed here to simplify the mathematical analysis for purposes of illustration.

For the embodiment illustrated in FIG. 5, the current in a triode-biased device, such as MOS transistors 610, 620, 630, and 640, may be written as $$I_{DS} = \kappa \left( V_G - V_{TH} - \frac{V_D + V_S}{2} \right) V_{DS} \quad (3)$$

where $I_{DS}$ is the drain-to-source current, $V_G$ is the gate voltage, $V_{TH}$ is the threshold voltage, $V_D$ is the drain voltage, $V_s$ is the source voltage, $V_{DS}$ is the drain-to-source voltage and $\kappa$ is a known value that may vary based, at least in part, upon temperature and device geometry.

Employing the conventional assumption of a substantially ideal amplifier, the drain-to-source current of transistor 640 should approximately equal the drain-to-source current of transistor 610 and, likewise, the drain-to-source current of transistor 630 should approximately equal the drain-to-source current of transistor 620. Utilizing these equalities and equation (3) above results in two equations that may be subtracted to yield the following result.

$$V_{ID}(V_c - V_{TH} - V_{IC}) = V_{OD}(V_c - V_{TH} - V_{OC}) \quad (4)$$

or $$V_{OD} = V_{ID}\left( \frac{V_c - V_{TH} - V_{IC}}{V_c - V_{TH} - V_{OC}} \right) \quad (4a)$$

where $V_{ID}$ is the differential input voltage, $V_{IC}$ is the common mode input voltage, $V_{OD}$ is the differential output voltage and $V_{OC}$ is the common mode output voltage.

For the embodiment illustrated in FIG. 5, $$V_{IC}=V_{cref}$$

$$V_{OC}=V_{cref}+(\gamma-0.5)V_{ID} \quad (5)$$

Inserting equation (5) for $V_{OC}$ into equation (4a) and letting $V_c'=V_c-V_{TH}-V_{cref}$ results in $$V_{OD} = V_{ID} \cdot 1/\left[ 1 - \frac{(\gamma - 0.5)V_{ID}}{V_c'} \right] \quad (5a)$$

which, for relatively small values of $$\frac{(\gamma - 0.5)V_{ID}}{V_c'},$$

may be approximated as $$\approx V_{ID}\left[ 1 + \frac{(\gamma - 0.5)V_{ID}}{V_c'} \right] \quad (5b)$$

-continued $$= V_{ID} + V_{ID}^2 \left[ \frac{(\gamma - 0.5)}{V_c - V_{TH} - V_{cref}} \right] \quad (5c)$$

Employing these mathematical manipulations, therefore, yields the following equation for the differential output voltage signal.

$$V_{OD} \approx V_{ID} + \left( \frac{\gamma - 0.5}{V_c - V_{TH} - V_{cref}} \right) V_{ID}^2 \quad (6)$$

Equation (6) above illustrates that, for the embodiment illustrated in FIG. 5, the magnitude of the second-order harmonic component of the differential input voltage signal applied to the differential amplifier circuit that may be introduced into the differential output voltage signal may be adjusted by adjusting $\gamma$ and/or by adjusting $V_c$.

The equations above were obtained by driving the differential amplifier circuit so that a fraction of the differential input voltage signal applied to the differential amplifier circuit is included as the common mode of the output voltage signal of the differential amplifier circuit. The common mode feedback voltage signal in this particular embodiment provides a mechanism to accomplish this, as illustrated in FIG. 5. However, as previously indicated, alternatively, the common mode feedback voltage signal may be obtained by using the differential output voltage signal, such as for the embodiment illustrated in FIG. 1. It may, likewise, be demonstrated that this approach will produce a result similar to equation (6) above. One advantage of the FIG. 5 embodiment over the FIG. 1 embodiment, however, is that the FIG. 5 embodiment provides more bandwidth. This is due, at least in part, to the use of the differential input voltage signal applied to the differential amplifier circuit, such as illustrated in FIG. 5, instead of using the differential output voltage signal, such as illustrated in FIG. 1. Less delay occurs in the FIG. 5 embodiment, for example. This reduction in delay, therefore, increases the bandwidth of the embodiment of a differential amplifier circuit in accordance with the invention.

Figure 3:
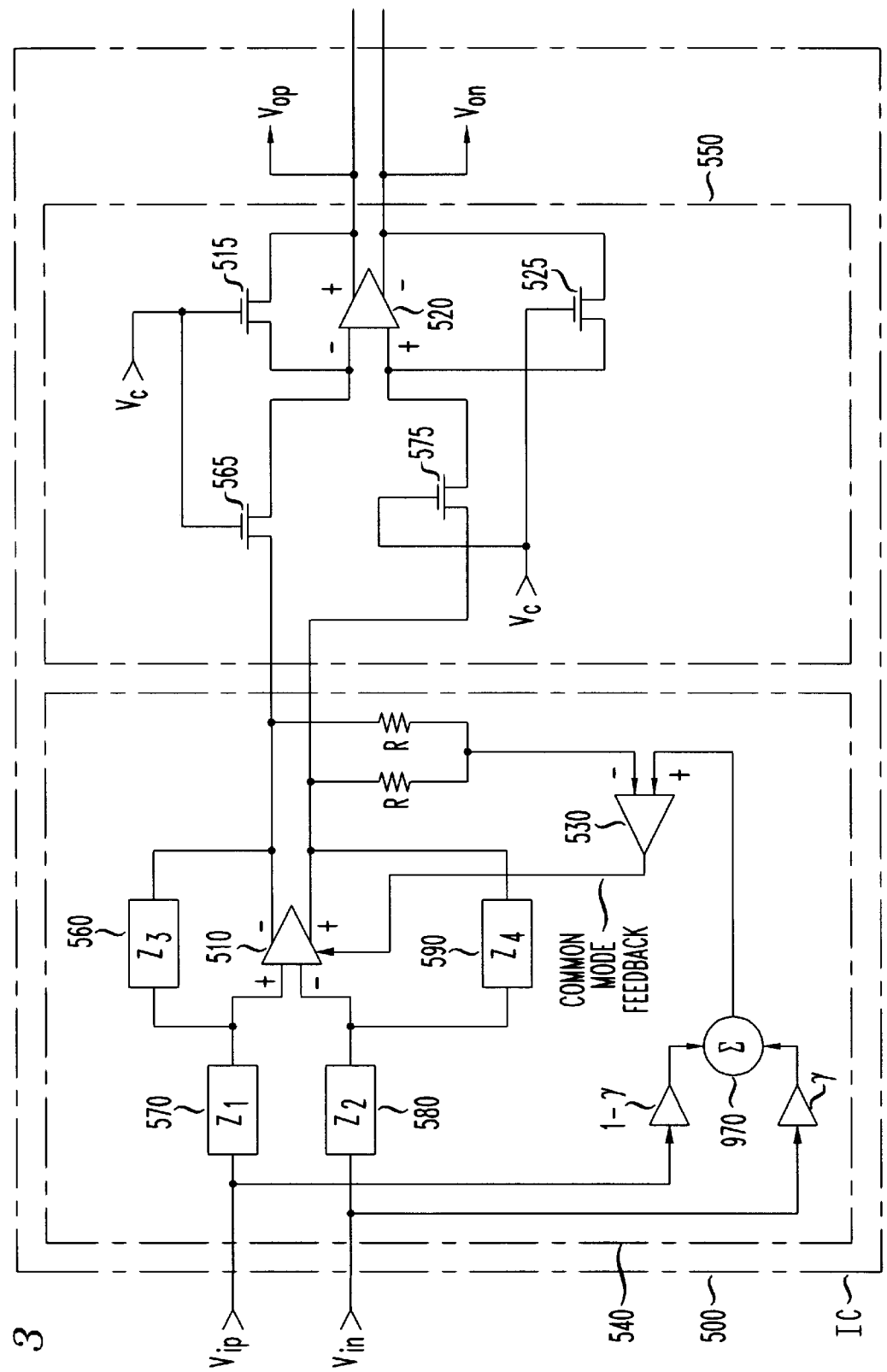
FIG. 3 is a circuit diagram illustrating an alternative embodiment of a differential amplifier circuit in accordance with the invention.

FIG. 3 illustrates yet another alternative embodiment 500 of a differential amplifier circuit in accordance with the invention. In FIG. 3, embodiment 500 is illustrated as embodied in or on an integrated circuit, although the invention is not limited in scope in this respect. The approach employed in this particular embodiment is similar to the approach employed in the embodiment shown in FIG. 5 in that a fraction of the differential input voltage signal applied to the differential amplifier circuit is added to the common mode of the output voltage signal of a differential amplifier via the common mode feedback voltage signal. However, whereas for the embodiment illustrated in FIG. 5 the common mode feedback voltage signal was applied to a differential amplifier employed in a triode-biased circuit configuration, e.g., with the differential amplifier coupled to MOS transistors biased to operate in their triode region, such as differential amplifier 600 in FIG. 5, in contrast, for embodiment 500 of a differential amplifier circuit in accordance with the invention illustrated in FIG. 3, the embodiment comprises a linear amplifier circuit portion 540 and a triode-biased amplifier circuit portion 550. In fact, in this particular embodiment, the triode-biased amplifier circuit portion 550 comprises a conventional MOSFET-C circuit portion including a differential amplifier, where the conventional feedback capacitors for the MOSFET-C circuit are replaced with triode-biased MOS transistors 515 and 525. Likewise, although not explicitly illustrated in FIG. 3, differential amplifier 520 is assumed to include conventional common mode feedback circuitry.

Whereas previously, such as illustrated in FIG. 5, the common mode feedback voltage signal was applied to a differential amplifier coupled in a triode-biased amplifier circuit configuration, instead for the embodiment illustrated in FIG. 3, the common mode feedback voltage signal is applied to differential amplifier 510, which is coupled in a linear amplifier circuit configuration at least in part. For example, in this particular embodiment, linear amplifier configuration 540 includes impedances 560, 570, 580, and 590. Depending upon the particular implementation, these impedances may comprise, for example, resistances, capacitances, or combinations thereof. Likewise, this particular linear amplifier circuit configuration employs the approach illustrated by the embodiment of FIG. 5 in which a fraction of the differential input voltage signal applied to the differential amplifier circuit is added to the common mode of the output voltage signal of the differential amplifier via the common mode feedback voltage signal of the differential amplifier; however, in this particular embodiment, the output voltage signal is the output voltage signal of differential amplifier 510, not a differential amplifier employed in a triode-based amplifier circuit configuration, such as differential amplifier 600 in FIG. 5, and the common mode feedback voltage signal is the common mode feedback voltage signal of differential amplifier 510.

When this particular configuration is employed, the common mode output voltage signal of differential amplifier 510 may be given by the following equation.

$$V_{OC} = V_{cref} + (\gamma - 0.5)V_{ID} \quad (7)$$

where $V_{ID}$ is the differential input voltage signal applied to embodiment 500 of a differential amplifier circuit in accordance with the invention.

However, as illustrated by the embodiment shown in FIG. 3, the inverting and noninverting output voltage signals of differential amplifier 510 are likewise applied to triode-biased amplifier circuit configuration 550. Due to equation (7) above, the common mode input voltage signal of triode-based amplifier circuit configuration 550 may be given by the following equation.

$$V_{IC} = V_{cref} + (\gamma - 0.5)V_{ID} \quad (8)$$

Thus, by this technique the differential output voltage signal of a differential amplifier circuit, which in this particular embodiment is the output voltage signal of amplifier 520, includes a scalable second-order harmonic component of the differential input voltage signal applied to the differential amplifier circuit, as desired. It will now be appreciated by one of ordinary skill in the art that the approach employed in the embodiment illustrated in FIG. 1 may, likewise, be adapted for an embodiment of a differential amplifier in accordance with the invention including a linear amplifier circuit portion and a triode-biased amplifier circuit portion. In one such embodiment, for example, the common mode input voltage signal of a first differential amplifier in the triode-biased amplifier circuit portion may include an adjustable fraction of the differential output voltage signal of a second differential amplifier in the linear amplifier circuit portion.

Figure 4:
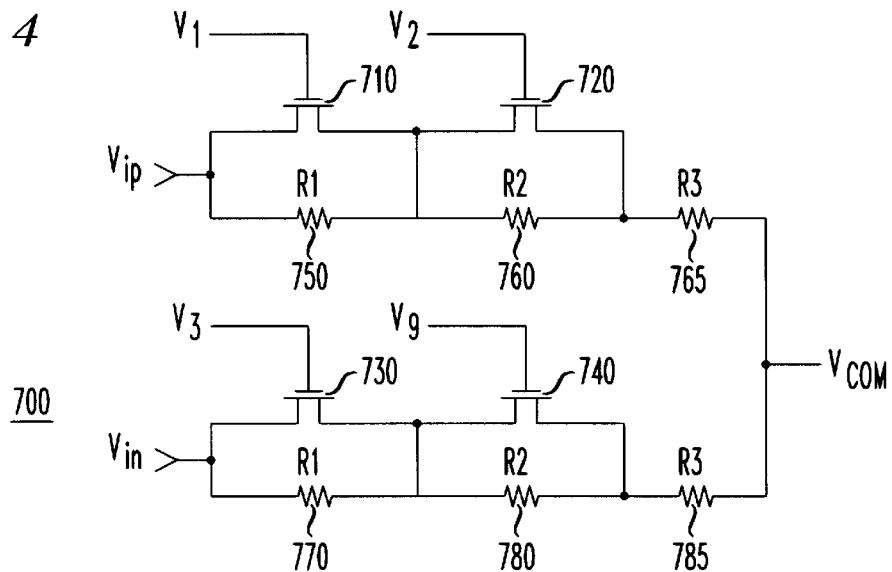
FIG. 4 is a circuit diagram illustrating a portion of another embodiment of a differential amplifier circuit in accordance with the invention.

FIG. 4 is a circuit diagram illustrating a portion of another embodiment of a differential amplifier circuit in accordance with the invention. As illustrated in FIG. 4, the differential input voltage signal of a differential amplifier circuit may be provided to a resistor network that may include series and/or parallel switches in the form of MOS transistors. For example, for the network illustrated, the output signal produced by this particular network, $V_{COM}$, may be provided to a differential amplifier, such as amplifier 675 illustrated in FIG. 5, and thereby provide a common mode feedback voltage signal, similar to the approach employed in connection with the embodiment illustrated in FIG. 5. Where this configuration is employed, MOS transistors, such as 710, 720, 730 and 740, may be actuated in response to externally-derived voltage signals applied to their respective gates to adjust the magnitude of the second-order harmonic signal produced by the differential amplifier circuit. Likewise, other configurations in which the magnitude of the second-order harmonic component signal produced may be digitally-controlled may be configured.

It will, of course, be appreciated that a differential amplifier circuit in accordance with the present invention is not limited in scope to the particular embodiments illustrated. For example, in an embodiment in which $V_c$ is used to control or adjust the magnitude of the second-order harmonic component of the differential input voltage signal applied to the differential amplifier circuit, any one of a number of schemes may be employed to adjust $V_c$. For example, in an embodiment in which binary digital signals are employed, such as described in aforementioned concurrently filed U.S. patent application ser. No. 08/534,524, the binary digital signals may be integrated or summed to provide a digital signal control and this digital signal control may be provided to a digital-to-analog converter (DAC) to provide an analog signal for $V_c$. Furthermore, the invention is not restricted in scope to employing either $\gamma$ or $V_c$ to scale the second-order harmonic component of the differential input voltage signal. These and other parameters may be adjusted individually or in combination, depending on the particular embodiment. For example, in one embodiment of a differential amplifier circuit in accordance with the invention, $\gamma$ may be employed to provide a coarse adjustment and $V_c$ may be employed to provide a fine adjustment to scale the second-order harmonic component. More specifically, a differential amplifier circuit in accordance with the invention may be employed, for example, in an embodiment of a read channel as described in aforementioned concurrently filed patent application Ser. No. 08/534,524. For example, in such a read channel, $V_c$ may be adjustable adaptively under closed loop control so as to provide real-time fine adjustment, whereas $\gamma$ may be adjustable, for example, based on externally-derived signals, such as described, for example, in connection with FIG. 4. For example, the coarse adjustment may be programmable, although, of course, the invention is not restricted in scope to this particular approach.

Figure 6:
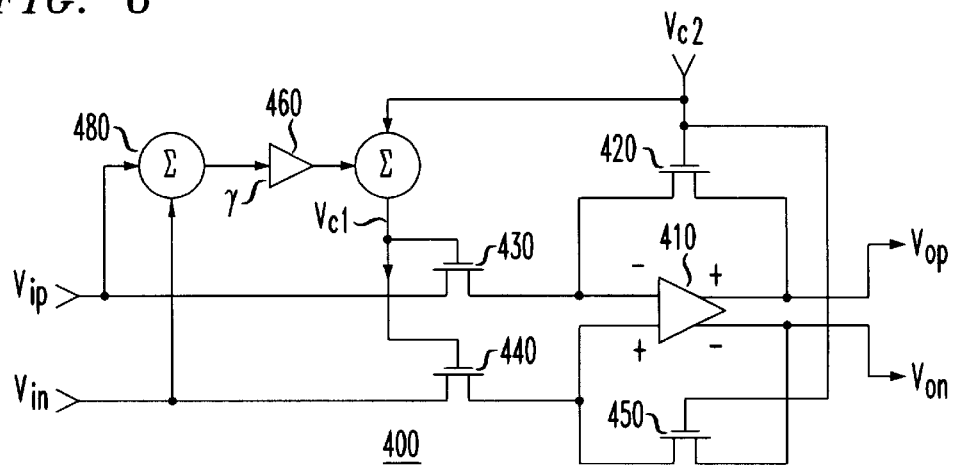
FIG. 6 is a circuit diagram illustrating still another embodiment of a differential amplifier circuit in accordance with the invention.

Likewise, in an alternative embodiment, the gain of the differential amplifier in a differential amplifier circuit in accordance with the invention may be adjusted to scale the second-order harmonic component of the differential input voltage signal. For example, referring to embodiment 400 illustrated in FIG. 6, again a triode-biased amplifier circuit configuration may be employed, such as differential amplifier 410 and MOS transistors 420, 430, 440 and 450 coupled in the configuration illustrated. In this particular embodiment, although not explicitly illustrated, differential amplifier 410 is assumed to include conventional common mode feedback circuitry. It may be demonstrated that for this differential amplifier circuit configuration, the gain may be given by the following equation.

$$\text{Gain} = \frac{V'_{c_1}}{V'_{c_2}} \tag{9}$$

where the $V'_{c1}$ and $V'_{c2}$ are given by the following equations, $$V'_{c1} = V_{c1} - V_{TH} - V_{common}$$

$$V'_{c2} = V_{c2} - V_{TH} - V_{common} \tag{10}$$

where $V_{TH}$ is the threshold voltage and $V_{common}$ is the common mode voltage. As illustrated by the embodiment of FIG. 6, $V_{c1}$ is given by the following equation.

$$V_{c1} = V_{c2} + \gamma V_{ID} \tag{11}$$

where $$V_{ID} = V_{ip} - V_{in}$$

Applying equations (10) and (11) to equation (9) gives the following expression for the gain.

$$\text{Gain} = \frac{V'_{c_2}}{V'_{c_1}} \approx \frac{V_{c2} + \gamma V_{ID}}{V_{c2}} = 1 + \frac{\gamma}{V_{c2}} V_{ID} \tag{12}$$

Thus, for embodiment 400 of a differential amplifier circuit in accordance with the invention, $$V_{out} = V_{in} \left[ 1 + \frac{\gamma}{V_{c2}} V_{in} \right] \tag{13}$$

indicating that the gain is adjustable at least in part in accordance with control voltage $V_{c2}$.

A differential amplifier circuit in accordance with the invention, such as embodiments 250 and 270, for example, may be driven to generate a second-order harmonic component of a differential input voltage signal applied to the differential amplifier circuit. Likewise, its differential amplifier circuit may be driven so that the differential input voltage signal includes a scaled fraction of the second-order harmonic component. A differential amplifier, such as differential amplifiers 900 or 600 as previously described, for example, may be driven in a manner so that the common mode output voltage signal includes a fraction of the differential output voltage signal of the differential amplifier circuit or includes a fraction of the differential input voltage signal applied to the differential amplifier circuit, respectively. Likewise, the common mode output voltage signal of the differential amplifier may be driven so as to include a scaled fraction of the differential output voltage signal of the differential amplifier circuit or the differential input voltage signal applied to the differential amplifier circuit. Furthermore, the common mode input voltage signal of a differential amplifier may be driven so as to include a scaled fraction of the differential output voltage signal of another differential amplifier, or a scaled fraction of the differential input voltage signal applied to the differential amplifier circuit, such as illustrated in FIG. 3, for example. In such embodiments, a second-order harmonic component of the differential input voltage signal in the differential output voltage signal of the differential amplifier circuit may be adjusted or scaled by a variety of techniques such as by adjusting relative resistances, adjusting control voltages, adjusting amplifier gain, or combinations thereof, as previously described. For example, where one of the previous techniques is employed to provide a coarse adjustment to the amplitude of the second-order harmonic component generated, such as by adjusting the fraction of the differential input voltage signal based on relative resistor values, for example, a fine adjustment of scaling may occur by driving selected controlling gate voltages for the MOS transistors of the circuit configuration. For the embodiments illustrated in FIGS. 1 and 5, respectively, for example, the controlling gate voltages for transistors 610, 620, 630 and 640 or for transistors 910, 920, 930 and 940 may be driven, as previously described. Further, alternatively, the gain of the differential amplifier may be adjusted to scale the amplitude of the second-order harmonic component of the differential input voltage signal applied to the differential amplifier, such as described in connection with the embodiment illustrated in FIG. 6. For example, selected controlling gate voltages may be driven in a manner to include a scaled fraction of the differential input voltage signal.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

The invention claimed is:

1. An integrated circuit comprising:
    a first differential amplifier having inverting and noninverting inputs coupled to receive a differential input signal, and also having inverting and noninverting outputs that produce a differential output signal; said first differential amplifier further having a common mode input coupled to receive a feedback signal, wherein the inverting and noninverting outputs of said first differential amplifier are coupled through gain control circuits having gains of $\gamma$ and $1-\gamma$, respectively, with the gain of each control circuit being controlled by series resistors coupled between an input signal node and an adder node, with a switch in the form of a MOS transistor connected across a corresponding resistor, and with said adder node coupled to a first input of a second differential amplifier, and with said second differential amplifier having a second input coupled to receive a common mode reference signal and an output that provides said feedback signal.

2. The circuit of claim 1 wherein a first MOS transistor is coupled to the noninverting input of the first differential amplifier, a second MOS transistor is coupled to the inverting input of the first differential amplifier, a third MOS transistor is coupled between the inverting input of the first differential amplifier and the noninverting output, and a fourth MOS transistor is coupled between the noninverting input of the first differential amplifier and the inverting output.

3. The circuit of claim 2 wherein each of said MOS transistors includes a controlling gate voltage;
    said first differential amplifier being coupled so that adjusting the controlling gate voltage of the third and fourth MOS transistors scales the amplitude of a second-order harmonic component of said differential input signal included in said differential output signal.

4. A method of operating an integrated circuit comprising the step of:
    applying a differential input signal to a first differential amplifier having inverting and noninverting inputs, and also having inverting and noninverting outputs that produce a differential output signal;
    wherein said first differential amplifier further has a common mode input coupled to receive a feedback signal, wherein the inverting and noninverting outputs of said differential amplifier are coupled through gain control circuits having gains of $\gamma$ and $1-\gamma$, respectively, with the gain of each control circuit being controlled by series resistors coupled between an input signal node and an adder node, with a switch in the form of a MOS transistor connected across a corresponding resistor, and with said adder node coupled to a first input of a second differential amplifier, and with said second differential amplifier having a second input coupled to receive a common mode reference signal and an output that provides said feedback signal.

5. The method of claim 4 wherein a first MOS transistor is coupled to the noninverting input of the first differential amplifier, a second MOS transistor is coupled to the inverting input f the first differential amplifier, a third MOS transistor is coupled between the inverting input of the first differential amplifier and the noninverting output, and a fourth MOS transistor is coupled between the noninverting input of the first differential amplifier and the inverting output.

6. The method of claim 5 wherein each of said MOS transistors includes a controlling gate voltage;
    said first differential amplifier being coupled so that adjusting the controlling gate voltage of the third and fourth MOS transistors scales the amplitude of second-order harmonic component of said differential input signal included in said differential output signal.

7. An integrated circuit comprising:
    a first differential amplifier having inverting and noninverting inputs coupled to receive a differential input signal, and also having inverting and noninverting outputs that produce a differential output signal; said first differential amplifier further having a common mode input coupled to receive a feed-forward signal, wherein the inverting and noninverting inputs of said first differential amplifier are coupled through gain control circuits having gains of $\gamma$ and $1-\gamma$, respectively, with the gain of each control circuit being controlled by series resistors coupled between an input signal node and an adder node, with a switch in the form of a MOS transistor connected across a corresponding resistor, and with said adder node coupled to a first input of a second differential amplifier, and with said second differential amplifier having a second input coupled to receive a common mode reference signal and an output that provides said feed-forward signal.

8. The circuit of claim 7 wherein a first MOS transistor is coupled to the noninverting input of the first differential amplifier, a second MOS transistor is coupled to the inverting input of the first differential amplifier, a third MOS transistor is coupled between the inverting input of the first differential amplifier and the noninverting output, and a fourth MOS transistor is coupled between the noninverting input of the first differential amplifier and the inverting output.

9. The circuit of claim 8 wherein each of said MOS transistors includes a controlling gate voltage;
    said first differential amplifier being coupled so that adjusting the controlling gate voltage of the third and fourth MOS transistors scales the amplitude of the a second-order harmonic component of said differential input signal included in said differential output signal.

10. A method of operating an integrated circuit comprising the step of:
    applying a differential input signal to a first differential amplifier having inverting and noninverting inputs, and also having inverting and noninverting outputs that produce a differential output signal.
    Wherein said first differential amplifier further has a common mode input coupled to receive feed-forward signal, wherein the inverting and noninverting inputs of said first differential amplifier are coupled through gain control circuits having gains of γ and 1−γ, respectively, with the gain of each control circuit being controlled by series resistors coupled between an input signal node and an adder node, with a switch in the form of a MOS transistor connected across a corresponding resistor, and with said adder node coupled to a first input of a second differential amplifier, and with said second differential amplifier having a second input coupled to receive a common mode reference signal and an output that provides said feed-forward signal.

11. The method of claim 10 wherein a first MOS transistor is coupled to the noninverting input of the first differential amplifier, a second MOS transistor is coupled to the inverting input of the first differential amplifier, a third MOS transistor is coupled between the inverting input of the first differential amplifier and the noninverting output, and a fourth MOS transistor is coupled between the noninverting input of the first differential amplifier and the inverting output.

12. The method of claim 11 wherein each of said MOS transistors includes a controlling gate voltage;

said first differential amplifier being coupled so that adjusting the controlling gate voltage of the third and fourth MOS transistors scales the amplitude of a second-order harmonic component of said differential input signal included in said differential output signal.

* * * * *